(12) United States Patent
Marsh (10) Patent No.: US 8,945,305 B2
(45) Date of Patent: Feb. 3, 2015

(54) METHODS OF SELECTIVELY FORMING A MATERIAL USING PARYLENE COATING

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 589 days.

(21) Appl. No.: 12/872,608

(22) Filed: Aug. 31, 2010

(65) Prior Publication Data

US 2012/0052681 A1  Mar. 1, 2012

(51) Int. Cl.
*C30B 25/04* (2006.01)
*H01L 21/02* (2006.01)
(Continued)

(52) U.S. Cl.
CPC ........ *H01L 21/0228* (2013.01); *C23C 16/0227* (2013.01); *C23C 16/042* (2013.01); *C23C 16/045* (2013.01); *C23C 16/45534* (2013.01); *H01L 21/02175* (2013.01);
(Continued)

(58) Field of Classification Search
CPC ........ C30B 25/00; C30B 25/02; C30B 25/04; C30B 25/16; C23C 16/00; C23C 16/02; C23C 16/0209; C23C 16/0227; C23C 16/04; C23C 16/042; H01L 21/0228; H01L 21/02304; H01L 21/28562; H01L 21/76879
USPC ................. 117/84, 88, 94–97, 103–104, 106, 117/108–109; 438/492–496, 503–505, 438/507–509, 758, 761, 763, 778, 780–781, 438/787, 790
See application file for complete search history.

(56) References Cited

U.S. PATENT DOCUMENTS 6,482,733 B2    11/2002  Raaijmakers et al.
6,783,589 B2 *   8/2004  Dahl et al. ...................... 117/84
(Continued)

OTHER PUBLICATIONS

Kirsch, et al. publication entitled "Nucleation and growth study of atomic layer deposited HfO2 gate dielectrics resulting in improved scaling and electron mobility," Journal of Applied Physics, vol. 99, p. 0235508 (2006).*

(Continued)

*Primary Examiner* — Kenneth A Bratland, Jr.
(74) *Attorney, Agent, or Firm* — TraskBritt (57) ABSTRACT

Methods for depositing a material, such as a metal or a transition metal oxide, using an ALD (atomic layer deposition) process and resulting structures are disclosed. Such methods include treating a surface of a semiconductor structure periodically throughout the ALD process to regenerate a blocking material or to coat a blocking material that enables selective deposition of the material on a surface of a substrate. The surface treatment may reactivate a surface of the substrate toward the blocking material, may restore the blocking material after degradation occurs during the ALD process, and/or may coat the blocking material to prevent further degradation during the ALD process. For example, the surface treatment may be applied after performing one or more ALD cycles. Accordingly, the presently disclosed methods enable in situ restoration of blocking materials in ALD process that are generally incompatible with the blocking material and also enables selective deposition in recessed structures.

18 Claims, 3 Drawing Sheets

(51) Int. Cl.
*C23C 16/02* (2006.01)
*C23C 16/04* (2006.01)
*C23C 16/455* (2006.01)
*H01L 21/285* (2006.01)
*H01L 21/768* (2006.01)

(52) U.S. Cl.
CPC ... *H01L 21/02304* (2013.01); *H01L 21/28562* (2013.01); *H01L 21/76879* (2013.01)
USPC ............... 117/109; 117/84; 117/88; 117/94; 117/95; 117/96; 117/97; 117/103; 117/104; 117/106; 117/108; 438/492; 438/493; 438/494; 438/495; 438/496; 438/503; 438/504; 438/505; 438/507; 438/508; 438/509; 438/758; 438/761; 438/763; 438/778; 438/780; 438/781; 438/787; 438/790

(56) References Cited

U.S. PATENT DOCUMENTS

| | | | |
|---|---|---|---|
| 7,160,819 | B2 | 1/2007 | Conley, Jr. et al. |
| 7,510,942 | B2 * | 3/2009 | Dey et al. .................. 438/287 |
| 7,651,934 | B2 | 1/2010 | Lubomirsky et al. |
| 2001/0042505 | A1 * | 11/2001 | Vaartstra .................. 117/104 |
| 2008/0274282 | A1 | 11/2008 | Bent et al. |
| 2009/0275198 | A1 | 11/2009 | Kamepalli et al. |
| 2010/0124821 | A1 | 5/2010 | Marsh |
| 2011/0198736 | A1 * | 8/2011 | Shero et al. .................. 257/629 |

OTHER PUBLICATIONS

Toxipedia entry on Acrylic Acid, available at http://toxipedia.org/display/toxipedia/Acrylic+Acid, last updated Jun. 28, 2010.*

Xia, et al. publication entitled "Soft lithography," Annu. Rev. Mater. Sci., vol. 28, pp. 153-84 (1998).*

Chen, et al. publication entitled "Chemistry for positive pattern transfer using area-selective atomic layer deposition," Adv. Mater., vol. 18, pp. 1086-1090 (2006).*

K. Allmer, et al. publication entitled "Surface modification of polymers. I. Vapour phase photografting with acrylic acid," Journal of Polymer Science: Part A: Polymer Chemistry, vol. 26, pp. 2099-2111 (1988).*

Allmer et al., Surface Modification of Polymers. I. Vapour Phase Photografting with Acrylic Acid, Journal of Polymer Science: Part A: Polymer Chemistry, 1988, vol. 26, pp. 2099-2111.

Chen et al., Chemistry for Positive Pattern Trasfer Using Area-Selective Atomic Layer Deposition, Adv. Mater. 2006, vol. 18, pp. 1086-1090.

Chen et al., Highly Stable Monolayer Resists for Atomic Layer Deposition on Germanium and Silicon, Chem. Mater. 2006, vol. 18, pp. 3733-3741.

Chen et al., Substrate-Selective Chemical Vapor Deposition of Reactive Polymer Coatings, Adv. Mater. 2008, vol. 20, pp. 3474-3480.

Lee et al., Degradation of the Deposition Blocking Layer During Area-Selective Plasma-Enhanced Atomic Layer Deposition of Cobalt, Journal of the Korean Physical Society, vol. 56, No. 1, Jan. 2010, pp. 104-107.

Park et al., Microcontact Patterning of Ruthenium Gate Electrodes by Selective Area Atomic Layer Deposition, Applied Physics Letters, 2005, vol. 86, pp. 051903-1-051903-3.

Raiber et al., Removal of Self-Assembled Monolayers of Alkanethiolates on Gold by Plasma Cleaning, Surface Science, 2005, vol. 595, pp. 56-63.

Tatoulian et al., Plasma Surface Modification of Organic Materials: Comparison Between Plyethylene Films and Octadecyltrichlorosilane Self-Assembled Monolayers, Langmuir, 2004, vol. 20, pp. 10481-10489.

Xue et al., Chemical Modifications of Inert Organic Monolayers with Oxygen Plasma for Biosensor Applications, Langmuir, 2007, vol. 23, pp. 5831-5835.

* cited by examiner

METHODS OF SELECTIVELY FORMING A MATERIAL USING PARYLENE COATING

TECHNICAL FIELD

The invention, in various embodiments, relates generally to methods for performing atomic layer deposition (ALD). More particularly, this disclosure relates to methods of performing area-selective ALD.

BACKGROUND

ALD processes are used to produce thin, conformal films having high thickness accuracy and step coverage. ALD utilizes a series of sequential, self-limiting surface reactions, each forming a monolayer of adsorbed precursor, to form the film. ALD provides atomic layer control and enables the films to be deposited on structures having high aspect ratios. ALD conventionally uses two or more gaseous precursors, each being sequentially introduced into a reaction chamber. A wide variety of materials may be deposited by ALD, many of which are used in the fabrication of semiconductor devices and integrated circuits (ICs).

In a conventional ALD process, at least one precursor is introduced to a substrate in a reaction chamber in alternate pulses separated by inert gas purging (in flow type reactors) or by evacuation of the reactor (in high-vacuum type reactors). The precursors react with surface groups on the substrate, or chemisorb on exposed surfaces of the substrate. The inert gas may then be flowed into the reaction chamber to substantially remove the precursor from the chamber before introducing another precursor.

The possibility of altering functional groups on surfaces of substrates, such as silicon substrates, enables selective deposition of materials on the substrate by ALD. For example, surface treatments may be used to increase reactivity of the surface of the substrate or to block deposition on regions of the surface of the substrate. Exposed regions of a patterned surface of the substrate may be selectively treated to yield reactive surface regions including reactive functional groups, such as, organic terminal groups, that improve nucleation of the precursors during the ALD process.

One example of selective deposition of materials using an ALD process is the patterning of hafnium dioxide ($HfO_2$) on silicon using a blocking chemistry that involves siloxane attachment of compounds to surfaces of silicon dioxide ($SiO_2$). For example, the silicon dioxide may be deposited on the silicon using conventional techniques and, thereafter, conventional lithographic techniques may be used to pattern the silicon dioxide so that areas of the silicon are exposed through the silicon dioxide. Surfaces of the silicon dioxide may be exposed to octadecyltrichlorosilane (ODTS) to form an octadecyltrichlorosilane monolayer on the surfaces of the silicon dioxide. An ALD process may then be performed to selectively form the hafnium oxide on the silicon, without the hafnium oxide forming on the octadecyltrichlorosilane monolayer overlying the silicon dioxide.

Selective deposition of materials using an ALD process has also been demonstrated using a patterned organic material. For example, platinum (Pt) may be selectively deposited on silicon by an ALD process using 1-octadecene as a blocking material. Silicon dioxide is deposited and patterned over the silicon using conventional techniques. The 1-octadecene may be adsorbed to the silicon exposed through the silicon dioxide to form a patterned surface including nonreactive organic regions (i.e., 1-octadecene regions) and reactive cleared regions (i.e., regions of exposed silicon). An ALD process may be performed to selectively deposit the platinum over the exposed silicon regions without the platinum depositing on the 1-octadecene regions.

However, the ability to pattern organic materials using conventional lithographic techniques is limited since it is only possible to alter functional groups or deposit materials on horizontal surfaces of the substrate, not on surfaces of recessed structures in the substrate. Furthermore, conventional blocking materials are often not compatible with conventional ALD processes. For example, platinum deposition using a conventional ALD process is performed at temperatures of greater than or equal to 300° C. and may use oxygen as a reactant. Under such conditions, conventional surface treatments may be damaged, degraded or removed from the surface of the substrate, especially during ALD processes having longer cycle times, which are used to deposit increased thicknesses of material. For instance, rapid degradation of self-assembled monolayers, such as octadecyltrichlorosilane and alkanethiol monolayers, during ALD processes has been observed. See Tatoulian et al., "*Plasma Surface Modification of Organic Materials: Comparison between Polyethylene Films and Octadecyltrichlorosilane Self-Assembled Monolayers,*" Langmuir, 20,10481 (2004); Xue and Yang, "*Chemical Modifications of Inert Organic Monolayers with Oxygen Plasma for Biosensor Applications,*" Langmuir, 23, 5831 (2007); Raiber et al., "*Removal of Self-Assembled Monolayers of Alekanethiolates on Gold by Plasma Cleaning,*" Surf. Sci., 595, 56 (2005); "Park et al., "*Microcontact Patterning of Ruthenium Gate Electrodes by Selective Area Atomic Layer Deposition,*" App. Phys. Lett., 86, 051903 (2005); and Lee et al., "*Degradation of the Deposition Blocking Layer During Area-Selective Plasma-Enhanced Atomic Layer Deposition of Cobalt,*" Journal of the Korean Physical Society, 56, 1 (2010).

BRIEF DESCRIPTION OF THE SEVERAL VIEWS OF THE DRAWINGS

FIGS. 2A through 3B are cross-sectional views of work pieces formed according to embodiments of the present invention.

DETAILED DESCRIPTION

The illustrations presented herein are not meant to be actual views of any particular component, device, or system, but are merely idealized representations that are employed to describe embodiments of the present invention.

As used herein, the terms "atomic layer deposition" and "ALD" mean and include a deposition process in which a plurality of consecutive deposition cycles is conducted in a reaction chamber or a deposition chamber.

As used herein, the term "ALD process" means and includes a process of forming a material using ALD and the term "ALD material" means and includes a material formed by an ALD process.

As used herein, the term "ALD cycle" means and includes sequentially introducing each precursor into a reaction chamber or a deposition chamber separately followed by pumping/purging the reaction chamber or the deposition chamber with an inert gas to prevent mixing or reacting of the precursors.

As used herein, the term "substrate" means and includes a base material or construction upon which materials, such as the ALD material, are formed. The substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation or other semiconductor or optoelectronic materials, such as silicon-germanium ($Si_{1-x}Ge_x$), germanium (Ge), gallium arsenide (GaAs), gallium nitride (GaN), or indium phosphide (InP).

Methods for selectively depositing an ALD material on the substrate with respect to a blocking material using an atomic layer deposition (ALD) process are disclosed. For example, a blocking material may be formed over portions of a substrate or an intermediate material to prevent deposition of the ALD material on regions of the substrate or the intermediate material underlying the blocking material. Accordingly, the ALD process may be performed to selectively deposit the ALD material on surfaces of the substrate exposed through the blocking material. This ALD process is commonly referred to in the art as an "area-selective ALD" process. The ALD material selectively deposited on the substrate with respect to the blocking material may be any material that may be selectively deposited by ALD, such as a metal, a metal oxide, a metal nitride or a perovskite. The methods include performing at least one surface treatment on the blocking material between one or more ALD cycles. During the ALD process, the blocking material may be exposed to at least one of increased temperature and oxidizing gases that may damage or degrade the blocking material. The damaged or degraded blocking material may be rendered inoperable for the purpose of preventing formation of the ALD material during the ALD process, thus, resulting in the formation of the ALD material on undesired regions of the substrate. A surface treatment may be performed to restore or coat the blocking material periodically throughout the ALD process, enabling selective deposition of a greater thickness of the ALD material than achievable using conventional processes. The methods may additionally include reactivating a surface of the substrate or intermediate material toward the blocking material to facilitate regeneration of the blocking material. For example, the surface treatment may be applied after performing at least one ALD cycle during the ALD process. Accordingly, in situ regeneration of the blocking material enables continued selective deposition of the ALD material by the ALD process that may otherwise be incompatible with such blocking materials. Furthermore, the presently disclosed methods enable selective deposition of materials by ALD in recessed structures, as will be described.

Metals, such as platinum (Pt), silver (Ag), gold (Au), ruthenium (Ru), rhodium (Rh), palladium (Pd), osmium (Os) and iridium (Ir), aluminum (Al), titanium (Ti), zirconium (Zr), hafnium (Hf), tantalum (Ta), and tungsten (W), and oxides of such metals may be produced by the ALD processes. Metal oxides, such as hafnium oxide ($HfO_2$), zirconium oxide ($ZrO_2$), aluminum oxide ($Al_2O_3$) and zinc oxide (ZnO), are widely used in, for example, microelectronics, optoelectronics, ceramics, gas sensors and catalysts. Noble metals, such as platinum (Pt), are chemically stable and generally withstand oxidizing conditions. Therefore, noble metals are useful in integrated circuits (ICs) as electrodes in dynamic random access memories (DRAMs) and ferroelectric random access memories (FRAMs). For example, platinum has enormous application prospects in ICs due to its chemical stability and excellent electrical properties. Perovskites, such as barium strontium titanate ($Ba_{1-x}Sr_xTiO_3$, BST) and lead zirconate titanate (($Pb[Zr_xTi_{1-x}]O_3$, PZT), may also be produced by ALD processes. Perovskites are used in a variety of applications, such as for ferroelectric, dielectric, pyroelectric, or piezoelectric optoelectronic components. Metals, metal oxides, metal nitrides and perovskites may be deposited using ALD processes. Such metals and compounds are listed only as representative examples for the sake of clarity. The presently disclosed methods may be used to perform any ALD process.

Perovskites are becoming increasingly important as a material for resistive memory electrodes. Since dry etching and patterning of the perovskites can be challenging, the selective deposition process described herein provides distinct advantages for fabrication of resistive memory. In addition, precursors of the perovskites that do not react during ALD processes may be recovered in their original precursor form. Selective deposition of perovskites involves reaction of the precursors only at desired locations, thus increasing recovery of unreacted precursors and reducing deposition costs.

The following description provides specific details, such as material types, material thicknesses and processing conditions in order to provide a thorough description of embodiments of the invention. However, a person of ordinary skill in the art will understand that the embodiments of the invention may be practiced without employing these specific details. Indeed, the embodiments of the invention may be practiced in conjunction with conventional semiconductor fabrication techniques employed in the industry.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art.

Figure 1:
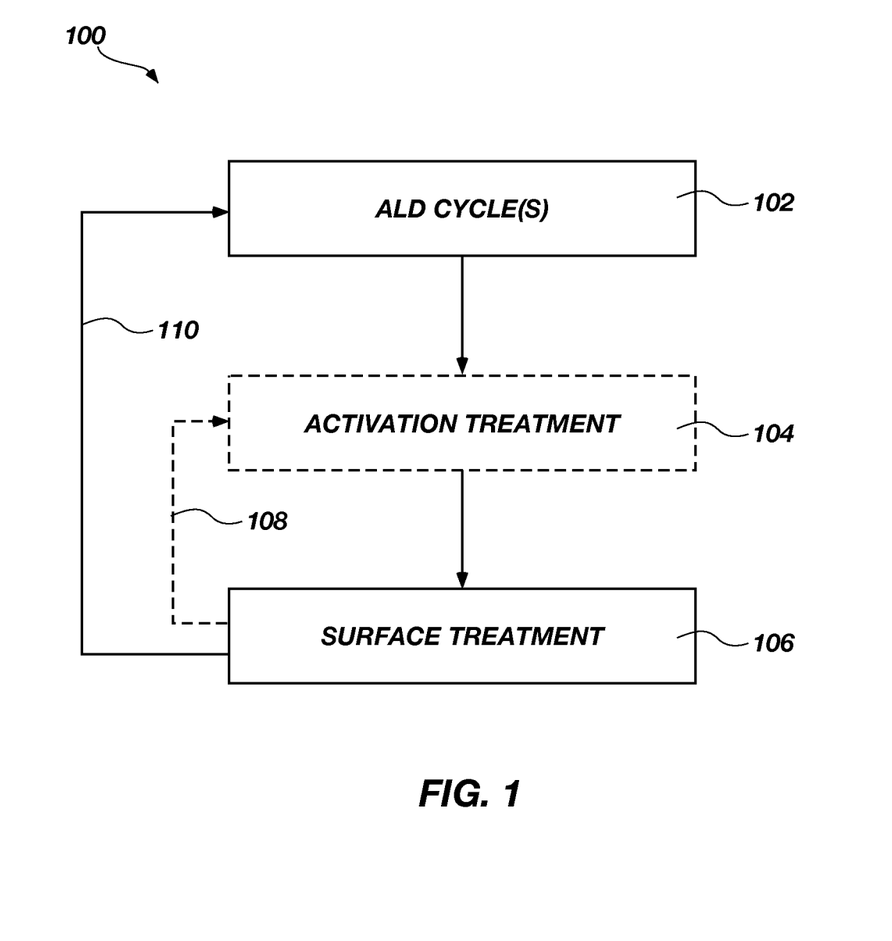
FIG. 1 is a flow diagram illustrating an atomic layer deposition (ALD) process according to an embodiment of the present invention.

FIG. 1 is a flow diagram illustrating an embodiment of a method of selectively forming an ALD material on a substrate by an ALD process 100. For example, a work piece may be formed that includes a blocking material overlying at least one region of the substrate. In some embodiments, the blocking material may be formed on a silicon substrate by attachment to terminal hydride groups on the regions of substrate. In other embodiments, the blocking material may be formed on an oxide material (i.e., the intermediate material) overlying the substrate by attachment to terminal hydroxide groups on the regions of the substrate.

The blocking material may be formed over surfaces of the substrate to prevent the ALD material from forming on such surfaces during the ALD process 100. In some embodiments, the blocking material may be formed on selected surfaces of the substrate using conventional deposition and patterning techniques, which are not described in detail herein. In other embodiments, the blocking material may be formed on surfaces of an intermediate material, such as a dielectric material, overlying selected surfaces of the substrate by conventional deposition and patterning techniques, which are not described in detail herein. For example, the blocking material may comprise an organic material, such as, a photoresist material, a vapor deposited polymer, an alkylchlorosilane material (e.g., octadecyltrichlorosilane (ODTS), dodecyltrichlorosilane, and trimethylchlorosilane), a chloroalkyl, a chloroalkene, 1-alkene or a 1-alkyne.

During the ALD process 100, the blocking material may prevent formation of the ALD material on regions of the substrate underlying the blocking material so that the ALD material is selectively formed on surfaces of the substrate exposed through the blocking material. The ALD process 100 may include performing one or more ALD cycles 102 to form the ALD material or a portion of the ALD material over regions of a substrate not in contact with the blocking material, optionally performing an activation treatment 104 to restore reactivity of the substrate to the blocking material and performing a surface treatment 106 to regenerate the blocking material overlying the substrate. In some embodiments, the blocking material may be degraded during a plurality of ALD cycles 102 and the activation treatment 104 and/or the surface treatment 106 may be performed after the plurality of ALD cycles 102 to restore or coat the blocking material. For example, the activation treatment 104 may include cleaning the surfaces of the substrate with a vapor phase treatment, such as ozone ($O_3$) or hydrofluoric acid (HF) to restore reactivity of the substrate or the intermediate material toward the blocking material. The substrate may be formed from any material on which ALD may be performed, such as, a semiconductor substrate, an oxide material, a glass material or a metalized polymer. The blocking material may include, for example, a resist material, an alkylchlorosilane material, a chloroalkyl material, a 1-alkene, a 1-alkyl, a fluorinated alkyl or a fluorinated polymer. In embodiments in which the blocking material includes a 1-alkene and a 1-alkyl, the blocking material may include less than about 20 carbon atoms.

The ALD cycle(s) 102 may be performed to form a first thickness of the ALD material on the surfaces of the substrate exposed through the blocking material. As a non-limiting example, the ALD material may include platinum, hafnium oxide, copper, titanium dioxide ($TiO_2$), nickel (Ni), molybdenum (Mo), zinc sulfide (ZnS), gallium arsenide, indium phosphide, tin dioxide ($SnO_2$), magnesium oxide ($MgO_2$), nickel oxide (NiO, $Ni_2O_3$), iridium, ruthenium, iridium dioxide ($IrO_2$), ruthenium oxide ($RuO_2$, $RuO_4$), barium strontium titanate ($Ba_{1-x}Sr_xTiO_3$, BST), lead zirconate titanate (($Pb[Zr_xTi_{1-x}]O_3$, PZT), germanium-antimony-tellurium ($Ge_2Sb_2Te_2$, GST), germanium sulfide (GeS), copper telluride (CuTe).

To deposit the ALD material on exposed portions of the substrate, the work piece may be placed into a reaction chamber (or may remain in the reaction chamber from previous processing) and, in a first reaction of the ALD process, a precursor may be introduced into the reaction chamber and may chemisorb to surfaces of the substrate exposed through the blocking material. The precursor may include any compound that exhibits sufficient volatility and sufficiently adsorbs onto or reacts with the surface of the substrate. The precursor supplied to the reaction chamber may be selected such that an amount of precursor that may be bound to the substrate surface is determined by the number of available binding sites and by the physical size of the chemisorbed species (including ligands) and such that these sites are fully saturated. The precursor may be introduced into the reaction chamber for an amount of time sufficient for the adsorption or reaction to occur, such as from about 0.1 second to about 30 seconds. For example, the precursor may be introduced into the reaction chamber at a flow rate of between about 0.1 sccm and about 10 sccm, a temperature of between about 100° C. and about 400° C., and a pressure of between about 0.0005 Ton and about 1 Torr. A first monolayer of the precursor may be formed on the surface of the substrate as the precursor is chemisorbed on the surface of substrate. The first monolayer formed by chemisorption of the precursor may be self-terminated since a surface of the first monolayer may be non-reactive with the precursor used in forming the first monolayer.

Examples of suitable ALD precursors include, but are not limited to, at least one of a metal alkyl, a metal alkyl amide, a metal alkoxide, a metal beta-diketonate, an organometallic compound, a metal carbonyl and a fluorinated self-assembled monolayer structure (SAM). Alkyl groups within the precursors may include, for example, ethyl, ethyl, isopropyl, propyl, butyl, tert-butyl. Examples of suitable ALD precursors include, but are not limited to, an aluminum-containing precursor, such as aluminum ethoxide ($Al(OC_2H_5)_3$), aluminum hexafluoroacetylacetonate ($Al(CF_3COCHCOCF_3)_3$) and trimethylaluminum (($CH_3)_3Al$); a barium-containing precursor, such as bis(n-propyltetramethylcyclopentadienyl)barium ($Ba[(C_3H_7)(CH_3)_4C_5]_2$); a copper-containing precursor, such as copper(II) trifluoroacetylacetonate ($Cu(CF_3COCHCOCH_3)_2$) and copper(II) trifluoroacetylacetonate (($C_5H_5)CuP(C_2H_5)_3$); a gallium-containing precursor, such as triethylgallium; a hafnium-containing precursor, such as bis(cyclopentadienyl)dimethylhafnium (($C_5H_5)_2Hf(CH_3)_2$) and tetrakis(dimethylamino)hafnium ($Hf(N(CH_3)_2)_4$); an iridium-containing precursor, such as $CH_3CpIr(CO)_3$; a lead-containing precursor; a nickel-containing precursor, such as nickel oxide (NiO) and bis(cyclopentadienyl) nickel (($C_5H_5)_2Ni$); an oxygen-containing precursor, such as water ($H_2O$) and oxygen ($O_2$); a platinum-containing precursor, such as (trimethyl)methylcyclopentadienylplatinum(IV) (($CH_3)_3(CH_3C_5H_4)Pt$); a ruthenium-containing precursor, such as bis(cyclopentadienyl)ruthenium (($C_5H_5)_2Ru$); a silicon-containing precursor, such as a hydride or a silane (e.g., hexachlorodisilane (HCD, $Si_2Cl_6$) dichlorosilane (DCS, $SiH_2Cl_2$), silane ($SiH_4$), disilane ($H_3SiSiH_3$), trichlorosilane (TCS, $SiHCl_3$); a strontium-containing precursor; a tantalum-containing precursor, such as tantalum(V) methoxide ($Ta(OCH_3)_5$) and pentakis(dimethylamino)tantalum(V) ($Ta[N(CH_3)_2]_5$); a titanium-containing precursor, such as tetrachlorodiaminetitanium(IV) ($TiCl_4(NH_3)_2$), tetrakis(diethylamino)titanium ($Ti[N(C_2H_5)_2]_4$) and titanium(IV) ethoxide ($Ti(OC_2H_5)_4$); a tungsten-containing precursor, such as mesitylene tungsten tricarbonyl ($C_9H_{12}W(CO)_3$); a zirconium-containing precursor, such as bis(cyclopentadienyl)dimethylzirconium (($C_5H_5)_2Zr(CH_3)_2$), tetrakis(diethylamino)zirconium ($Zr[N(CH_2CH_3)_2]_4$); and any other compound suitable for use as a precursor in an ALD process.

Subsequent pulsing with an inert gas removes excess precursor from the reaction chamber, specifically the precursor that has not chemisorbed to the surface of the substrate. The inert gas may be nitrogen ($N_2$), argon (Ar), helium (He), neon (Ne), krypton (Kr), xenon (Xe), or other gases that, although not inert, behave as inert under the conditions of the specific deposition. Purging the reaction chamber also removes volatile by-products produced during the ALD process. In one embodiment, the inert gas may be nitrogen ($N_2$). The inert gas may be introduced into the reaction chamber, for example, for from about 5 seconds to about 120 seconds. After purging, the reaction chamber may be evacuated or "pumped" to remove gases, such as excess precursor or volatile by-products. For example, the precursor may be purged from the reaction chamber by techniques including, but not limited to, contacting the substrate with the inert gas and/or lowering the pressure in the reaction chamber to below the deposition pressure of the precursor to reduce the concentration of the precursor contacting the substrate and/or chemisorbed species. Additionally, purging may include contacting the first monolayer with any substance that allows chemisorption by-products to desorb and reduces the concentration of the precursor before re-introducing the precursor or introducing another precursor. A suitable amount of purging to remove the excess precursor and the volatile by-products may be determined experimentally, as known to those of ordinary skill in the art. The pump and purge sequences may be repeated multiple times. The pump and purge sequences may start or end with either the pump or purge act. The time and parameters, such as gas flow, pressure and temperature, during the pump and purge acts may be altered during the pump and purge sequence.

Another reaction of the ALD process 100 includes re-introducing the precursor or introducing another, different precursor into the reaction chamber to form a second monolayer over the first monolayer. Depending on the ALD material to be formed, suitable precursors for forming the ALD material may be selected by a person of ordinary skill in the art. The second monolayer and the first monolayer may be reacted to form a desired ALD material. Reaction by-products and excess precursor may be removed from the reaction chamber by using the pump and purge sequence as described above. For example, a purge may be performed by introducing the inert gas into the reaction chamber. Conventionally, precursor pulse times range from about 0.5 second to about 30 seconds. A desired thickness of the ALD material may be deposited on the substrate through multiple, repetitious ALD cycles 102, where each ALD cycle 102 deposits a monolayer of material.

During the ALD cycles 102, the blocking material on the work piece may be exposed to increased temperatures and oxidizing gases, or reactive gases, that may degrade or deteriorate the blocking material. Such conditions may, additionally, decrease surface reactivity between the substrate or the intermediate material and the blocking material, causing detachment of the blocking material from the underlying material (i.e., the substrate or the intermediate material). For example, after depositing a first thickness of the ALD material on the substrate, degradation of the blocking material and/or reduced surface reactivity between the substrate and the blocking material may impede selective deposition of the ALD material with respect to the blocking material. Accordingly, the thickness of the ALD material may be limited by the number of ALD cycles 102 that may be performed before the blocking material begins to degrade, as will be described. The surface treatment 106 and, optionally, the activation treatment 104 may be performed to regenerate the blocking material over desired regions of the substrate. The activation treatment 104, if utilized, may include, for example, cleaning a surface of a substrate and, thereafter, optionally treating the surface of the substrate or the intermediate material to restore reactivity with the blocking material. The surface treatment 106 may include introducing at least one organic material to the substrate and remaining portions of the blocking material to regenerate or rebuild the blocking material. The activation treatment 104 and the surface treatment 106 may be performed in situ in the reaction chamber or may be performed ex situ. The activation treatment 104 and the surface treatment 106 described herein are not limited to any particular ALD process and may be used in combination with any ALD process known in the art wherein the ALD material is selectively deposited with respect to a blocking material. The activation treatment 104 and the surface treatment 106 are also not limited to ALD processes including any particular number of ALD cycles 102 and may be performed during deposition processes including any number of ALD cycles 102, or after a single ALD cycle, used to form the ALD material.

By restoring the blocking material that overlies regions of the substrate, the area-selective formation of increased thicknesses of ALD material and, furthermore, enables deposition of ALD material within recessed regions. Specifically, the blocking material may be formed over sidewalls of recessed regions preventing deposition of ALD material thereon and enabling selective deposition of ALD material on surfaces exposed by the recessed regions (i.e., bottom surfaces of the recessed regions).

Figure 2A:
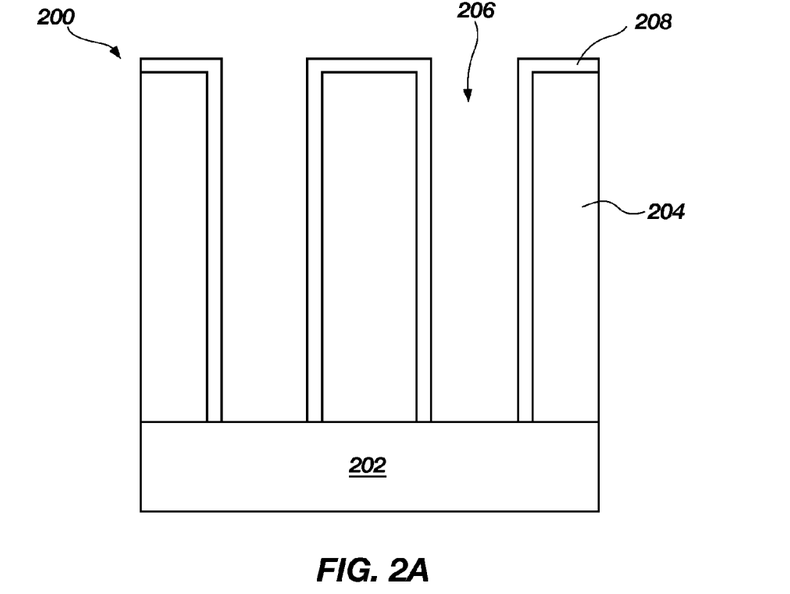

FIG. 2A depicts a work piece 200 that includes a substrate 202, a material 204, e.g., a dielectric material, over portions of a surface of the substrate 202 and a blocking material 208 over an intermediate material, such as material 204. As a non-limiting example, the substrate 202 may be a doped or undoped silicon material. The material 204 may be a silicon dioxide material formed by a technique known in the art, such as, for example, atomic layer deposition (ALD), chemical vapor deposition (CVD), or plasma vapor deposition (PVD). For example, the material 204 may have a thickness of between about 20 nm and about 500 nm. To produce the work piece 200 illustrated in FIG. 2A, the material 204 may be formed over the surface of the substrate 202 and a plurality of recesses 206 may be formed in the material 204 using, for example, a conventional reactive ion etching (RIE) process. For simplicity, the work piece 200 is depicted with two recesses 206 in the material 204. However, the material 204 may include any number of recesses 206, or a single recess 206.

The blocking material 208 may be formed on sidewalls and horizontal surfaces of the material 204 without being formed on surfaces of the substrate 202 such that the portions of the substrate 202 are exposed through the material 204 and the blocking material 208. For example, the blocking material 208 may be formed from an organic material that exhibits reactivity or affinity toward the material 204, such as a hydroxide terminated silane compound that forms a self-assembled monolayer (SAM). The blocking material 208 may be formed by depositing a photoresist, a vapor deposited polymer, or an alkylchlorosilane material, such as octadecyltrichlorosilane (ODTS), dodecyltrichlorosilane, trimethylchlorosilane and tridecafluoro-1,1,2,2-tetrahydrooctyltrichloro-silane (FOTS), which may self-assemble to form a continuous film over the material 204. For example, the blocking material 208 may be formed by exposing the surface of the work piece 200 (i.e., exposed surfaces of the substrate 202) to the alkylchlorosilane material under conditions in which the alkylchlorosilane material interacts with the material 204 to form the blocking material 208. As a non-limiting example, the material 204 may be formed from silicon dioxide and the blocking material 208 may be formed by exposing the surface of the work piece 200 to octadecyltrichlorosilane so that the octadecyltrichlorosilane reacts with the exposed surfaces of the material 204 to form a self-assembled siloxane monolayer over the material 204. Optionally, the surfaces of the material 204 may be prepared by at least one of cleaning and etching prior to forming the blocking material 208 thereon.

An ALD material 210 may be formed in the recesses 206 of the substrate 202 using the ALD process 100 described with respect to FIG. 1. During the ALD process 100, the blocking material 208 may prevent deposition of the ALD material 210 thereon. A first thickness D1 of the ALD material 210 may be formed on the exposed surfaces of the substrate 202 using at least one ALD cycle 102 (FIG. 1). For example, between about 5 ALD cycles and about 100 ALD cycles 102 may be performed to form the first thickness D1 of the ALD material 210. By way of example and not limitation, the blocking material 208 may be formed from octadecyltrichlorosilane, the ALD material 210 may be formed from platinum and between about 50 ALD cycles and about 100 ALD cycles 102 may be performed so that the first thickness D1 of the platinum is less than or equal to about 25 Å. In one embodiment, about 75 ALD cycles 102 are conducted to form the first thickness D1 of the platinum. As the blocking material 208 becomes damaged or degraded during the ALD cycles 102, the ALD material 210 may be undesirably formed on surfaces of the material 204 exposed by the degradation of the blocking material 208. Thus, the first thickness D1 of the ALD material 210 may be limited by the number of ALD cycles 102 that may be performed before the blocking material 208 is damaged or degraded.

The surface treatment 106 (FIG. 1) and, optionally, the activation treatment 104 (FIG. 1) may be performed to restore the blocking material 208 on the material 204 or to coat the remaining portions of the blocking material 208 and/or regions of the material 204 exposed by degradation of the blocking material 208. Optionally, the activation treatment 104 may be performed to increase the reactivity of the surface of the material 204 toward the blocking material 208. In some embodiments, the activation treatment 104 may be performed in situ with the ALD process 100 (FIG. 1) by exposing the work piece 200 to at least one activating agent in the reaction chamber after performing the ALD cycle(s) 102 (FIG. 1). In some embodiments, the activating agent may be introduced to the work piece 200 by bubbling an inert gas (i.e., nitrogen gas) through an aqueous hydrofluoric acid (HF) solution (i.e., 49% hydrofluoric acid in water) at a volume flow rate of from about 0.1 liter/minute to about 1 liter/minute for a duration of from about 1 minute to about 20 minutes. In other embodiments, the work piece 200 may be exposed to ozone at a flow rate of from about 1 slm to about 10 slm for a duration of from about 1 minute to about 5 minutes. In yet further embodiments, the work piece 200 may be removed from the reaction chamber and the activation treatment 104 may be performed ex situ.

In some embodiments, the surface treatment 106 of the ALD process 100 may be performed to reform the blocking material 208 on the regions of the material 204 (FIG. 2B) where the blocking material 208 may have been damaged or degraded during the ALD cycle(s) 102 (FIG. 1). For example, the surface treatment 106 may include exposing the work piece 200 to an organic material that reacts with exposed surfaces of the material 204 and remaining portions of the blocking material 208 to restore the blocking material 208. For example, the blocking material 208 may include a polymer material and the organic material may include a carboxylic acid (e.g., acrylic acid), which carboxylic acid may be grafted to remaining portions of the blocking material 208. For example, the blocking material 208 may comprise polyethylene or polystyrene and a solution of acrylic acid and benzophenone in a solvent, such as acetone, may be supplied into the reaction chamber in the vapor phase to initiate grafting of the acrylic acid to the blocking material 208 and/or exposed surfaces of the material 204 without being deposited on the ALD material 210.

Figure 2B:
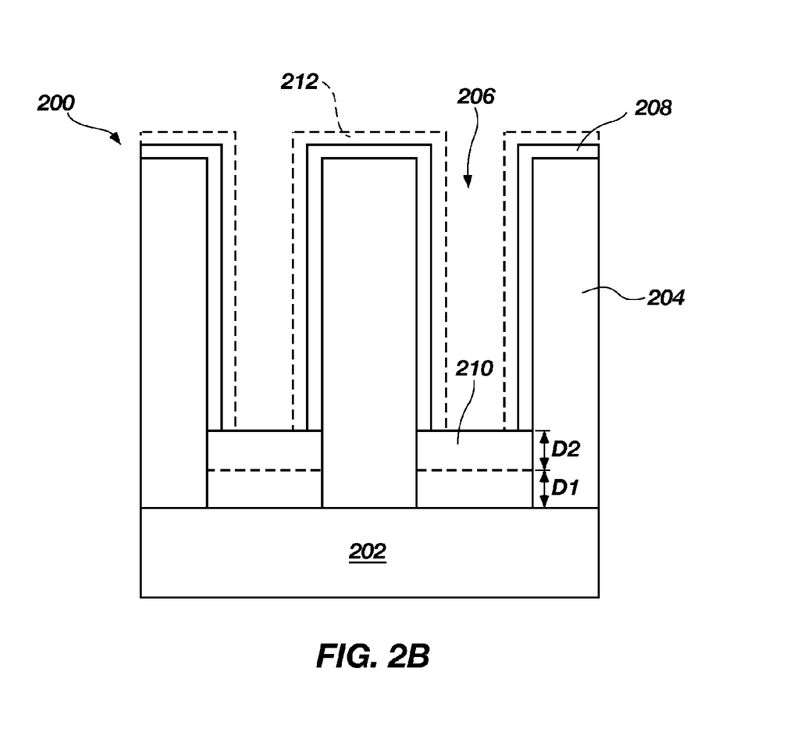

In other embodiments, the surface treatment 106 may be performed to coat the blocking material 208 to prevent damage or degradation to the blocking material 208 during the ALD cycle(s) 102. After forming a thickness (e.g., the first thickness D1) of the ALD material 210 using the ALD cycle(s), the surface treatment 106 may be performed to form a coating 212 (shown in broken lines) over exposed surfaces of the material 204 and/or remaining portions of the blocking material 208 selective to the ALD material 210. For example, the surface treatment 106 may include exposing the work piece 200 to a polymer material that polymerizes on exposed surfaces of the material 204 and/or remaining portions of the blocking material 208 to form a coating 212 (shown in broken lines) over the blocking material 208. The ALD material 210 may inhibit deposition of the polymer material over the ALD material 210 such that the coating 212 does not form over the ALD material 210. For example, the polymer material may include a parylene, such as a substituted [2.2]paracyclophane, and the blocking material 208 may be coated by exposing the blocking material 208 to the organic material in a sublimated or vapor state. The ALD material 210 may include a material that inhibits deposition of the polymer material, such as, platinum, gold, silver, nickel, copper, iridium, tungsten, tantalum and titanium. For example, the polymer material may be sublimated at a temperature of from about 75° C. to about 150° C. and introduced into the reaction chamber such that the polymer material polymerizes on the exposed surfaces of the material 204 and/or remaining portions of the blocking material 208 without polymerizing on the ALD material 210 to form the coating 212. The coating 212 may protect the blocking material 208 from further damage or degradation or may replace degraded or damaged regions of the blocking material 208.

The blocking material 208 may be restored or coated in situ by introducing the organic material to the work piece 200 in the reaction chamber after performing the ALD cycle(s) 102 (FIG. 1). In other embodiments, the work piece 200 may be removed from the reaction chamber and the organic material may be deposited on the exposed surfaces of the material 204 and remaining portions of the blocking material 208 using, for example, a conventional chemical vapor deposition (CVD) process. For example, if the blocking material 208 comprises a hydroxide terminated silane compound, the work piece 200 may be exposed to a vapor containing octadecyltrichlorosilane so that the octadecyltrichlorosilane reacts with the exposed surfaces of the material 204 and remaining portions of the blocking material 208. As the octadecyltrichlorosilane in the vapor contacts the exposed surfaces of the material 204 and remaining portions of the blocking material 208, a self-assembled monolayer of the blocking material 208 may form over the material 204. As indicated by arrow 108, and as shown in FIG. 1, the activation treatment 104 and the surface treatment 106 may be repeated any number of times in order to restore or coat the blocking material 208 overlying the material 204.

After regenerating the blocking material 208 over the material 204 on the work piece 200, one or more additional ALD cycles 102 (FIG. 1) may be performed, as indicated by arrow 110 (FIG. 1), to form a second thickness D2 of the ALD material 210 over the first thickness D1 of the ALD material 210. The ALD cycle(s) 102, the activation treatment 104 and the surface treatment 106 may be repeated to faun a desired thickness of the ALD material 210 on the substrate 202. By periodically performing the optional activation treatment 104 and the surface treatment 106 between the ALD cycles 102 to restore or coat the blocking material 208, the ALD material 210 having an increased thickness may be formed in comparison to the thickness formed using conventional area-selective ALD processes. For simplicity, the ALD material 210 is illustrated in FIG. 2 as including two thicknesses (i.e., the first and second thicknesses D1 and D2). However, any number of thicknesses of the ALD material 210 may be formed using the disclosed methods. The blocking material 208 may be damaged, degraded or removed during the ALD cycle(s) 102 as the thickness of the ALD material 210 increases. Conventional area-selective ALD processes may, therefore, be inadequate for forming the ALD material in recessed regions having greater depths (e.g., about 200 Å). Optionally performing the surface treatment 106 and the activation treatment 104 between one or more ALD cycles 102 to restore or coat the blocking material 208 during the ALD process 100 (FIG. 1), thus, enables area-selective deposition of the ALD material 210 in recessed regions, such as recesses 206.

Figure 3A:
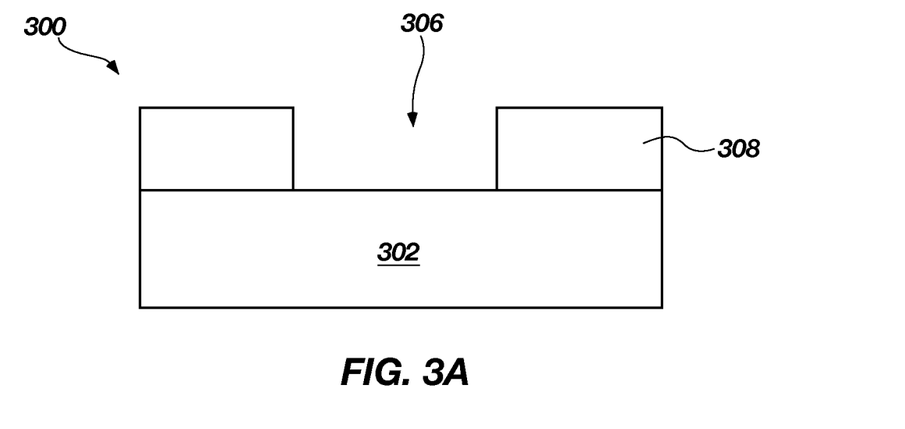

FIG. 3A depicts a work piece 300 that includes a substrate 302 having a blocking material 308 formed over portions of a surface of the substrate 302. For example, the blocking material 308 may be formed from an organic material, such as an amphiphilic material, that exhibits reactivity or affinity toward the substrate 302. By way of example and not limitation, the amphiphilic material may include at least one of a chloroalkyl, a chloralkene, a 1-alkene and a 1-alkyne. As another non-limiting example, the blocking material 308 may include a resist material or a polymer material, such as a photoresist material, polymethylglutarimide (PMGI), polyethylene, polystyrene, polyurethane, poly(methyl methacrylate) (PMMA), phenol formaldehyde, a novolac polycresole, a polyimide and a fluoro resin. The blocking material 308 may be formed over the substrate 302 using conventional deposition and pattering techniques, which are not described in detail herein. The blocking material 308 may be formed by exposing the surface of the work piece 300 (i.e., exposed surfaces of the substrate 302) to the amphiphilic material under conditions such that the amphiphilic material selectively interacts with exposed regions of the substrate 302. As a non-limiting example, the work piece 300 may be formed from silicon and the blocking material 308 may be formed by exposing the surface of the work piece 300 to 1-octadecene so that the 1-octadecene reacts with the exposed surfaces of the substrate 302 to form a self-assembled monolayer over the substrate 302. As another non-limiting example, the work piece 300 may be formed from silicon and the blocking material 308 may be formed by exposing the surface of the work piece 300 to bis(trimethylsilyl)telluride so that the bis(trimethylsilyl)telluride reacts with the exposed surfaces of the substrate 302 to form the blocking material 308 over the substrate 302. Optionally, the surface of the substrate 302 may be prepared by at least one of cleaning and etching prior to depositing the blocking material 308 thereon.

An opening 306 may be formed in the blocking material 308 to expose a surface of the substrate 302 using methods known in the art, such as, conventional lithographic techniques. For simplicity, the blocking material 308 shown in FIG. 3A includes a single opening 306. However, the blocking material 308 may include any number of openings 306.

An ALD material 310 may be formed on the exposed surface of the substrate 302 using the ALD process 100 described with respect to FIG. 1. A first thickness D3 of the ALD material 310 may be formed on the exposed surface of the substrate 302 using at least one ALD cycle 102 (FIG. 1). During the ALD cycle(s) 102, the blocking material 308 may prevent deposition of the ALD material 310 over surfaces of the substrate 302 underlying the blocking material 308. For example, between about 5 ALD cycles 102 and about 100 ALD cycles 102 and, more particularly, about 75 ALD cycles 102, may be performed to form the first thickness D3 of the ALD material 310 on the work piece 300. By way of non-limiting example, the blocking material 308 may be formed from 1-octadecene, the ALD material 310 may comprise platinum and from about 50 ALD cycles 102 to about 75 ALD cycles 102 may be performed so that the first thickness D3 of the platinum is less than or equal to about 25 Å. As another non-limiting example, the blocking material 308 may be formed from a polymer material, the ALD material 310 may comprise platinum and from about 10 ALD cycles 102 to about 20 ALD cycles 102 may be performed so that the first thickness D3 of the platinum is less than or equal to about 25 Å. During the ALD process, the blocking material 308 may become damaged or degraded and the reactivity of the surface of the substrate 302 toward the blocking material 308 may be diminished. As the blocking material 308 is damaged or degraded during the ALD cycle(s) 102, the ALD material 310 may be undesirably deposited on surfaces of the substrate 302 previously covered by the blocking material 308. Thus, the first thickness D3 of the ALD material 310 may be limited by the number of the ALD cycles 102 that may be performed before the blocking material 308 is damaged or degraded.

The blocking material 308 may be restored or coated by optionally performing the surface treatment 106 (FIG. 1) and the activation treatment 104 (FIG. 1) during the ALD process 100 (FIG. 1). To restore reactivity of the surface of the substrate 302 toward the blocking material 308, the activation treatment 104 may, optionally, be performed. As a on-limiting example, the substrate 302 may be formed from silicon and an oxidizing agent, such as oxygen, ozone, or water, may be introduced to the work piece 300 to increase surface reactivity of the silicon. In some embodiments, the activation treatment 104 may be performed in situ by introducing, for example, the oxidizing agent to the work piece 300 in the same reaction chamber in which the ALD process is performed. In other embodiments, the work piece 300 may be removed from the reaction chamber and the activation treatment 104 may be performed ex situ.

After restoring surface reactivity of the substrate 302 using the optional activation treatment 104, the surface treatment 106 may be performed to restore or to coat the blocking material 308 overlying the substrate 302. In some embodiments, the surface treatment 106 may include exposing the work piece 300 to an organic material that reacts with exposed surfaces of the substrate 302 and remaining portions of the blocking material 308 to restore the blocking material 308. For example, the blocking material 308 may be formed from the amphiphilic material or the resist material and an organic material may be introduced to exposed surfaces of the substrate 302 and remaining portions of the blocking material 308 to restore the blocking material 308.

In other embodiments, the surface treatment 106 may include exposing the work piece 300 to a polymer material that polymerizes on exposed surfaces of the substrate 302 and/or remaining portions of the blocking material 308 to form a coating 312 (shown in broken lines) over the blocking material 308. The ALD material 310 may inhibit deposition of the polymer material over the ALD material 310 such that the coating 312 does not form over the ALD material 310. For example, the polymer material may include a parylene, such as a substituted [2.2]paracyclophane, and the blocking material 308 may be restored by exposing the blocking material 308 to the organic material in a sublimated or vapor state. The ALD material 310 may include a material that inhibits deposition of the polymer material, such as, platinum, gold, silver, nickel, copper, iridium, tungsten, thallium and titanium. For example, the polymer material may be sublimated at a temperature of from about 75° C. to about 150° C. and introduced into the reaction chamber such that the polymer material polymerizes on the exposed surfaces of the substrate 302 and/or remaining portions of the blocking material 308 without polymerizing on the ALD material 310 to form the coating 312. The coating 312 may protect the blocking material 308 from further damage or degradation or may replace degraded or damaged regions of the blocking material 308.

As a non-limiting example, the surface treatment 106 (FIG. 1) may be performed in situ by introducing the organic material or the polymer material to the exposed surfaces of the substrate 302 and the remaining portions of the blocking material 308 in the same reaction chamber used to perform the ALD cycle(s) 102 (FIG. 1). As another non-limiting example, the work piece 300 may be removed from the reaction chamber and the surface treatment 106 may be performed by depositing the organic material or the polymer material over the exposed regions of the substrate 302 and the remaining portions of the blocking material 308 using, for example, a conventional chemical vapor deposition (CVD) process. For example, the blocking material 308 may include 1-octadecene and the work piece 300 may be exposed to a vapor containing 1-octadecene, so that the 1-octadecene reacts with the exposed regions of the substrate 302 and the remaining portions of the blocking material 308. As the 1-octadecene in the vapor contacts remaining portions of the blocking material 308, a self-assembled monolayer of the 1-octadecene may form over the exposed regions of the substrate 302 and the remaining portions of the blocking material 308. As another non-limiting example, the blocking material 308 may include 1-octadecene and the work piece 300 may be exposed to a vapor containing a substituted parylene so that the substituted parylene polymerizes over exposed surfaces of the substrate 302 and the remaining portions of the blocking material 308 without depositing on the ALD material 310. As the substituted parylene in the vapor contacts remaining portions of the blocking material 308, the substituted parylene may polymerize over the exposed regions of the substrate 302 and the remaining portions of the blocking material 308 to form the coating 312 thereover. As indicated by arrow 108 (FIG. 1), the activation treatment 104 and the surface treatment 106 may be repeated any number of times in order to restore or to coat the blocking material 308 overlying the substrate 302.

Figure 3B:
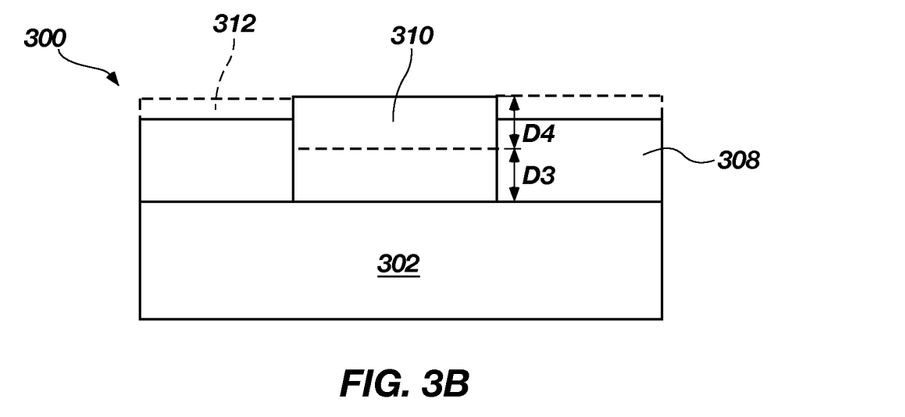

After performing the surface treatment 106 to regenerate or coat the blocking material 308, at least another ALD cycle 102 (FIG. 1) may be performed, as indicated by arrow 110, to form a second thickness D4 of the ALD material 310 over the first thickness D3 of the ALD material 310. The ALD cycle(s) 102, the surface treatment 106 and, optionally, the activation treatment 104 may be repeated to form a desired thickness of the ALD material 310. By periodically performing the surface treatment 106 and, optionally, performing the activation treatment 104 between the ALD cycles 102, an increased thickness of the ALD material 310 may be formed in comparison to that formed using conventional area-selective ALD processes. For simplicity, as illustrated in FIG. 3B, the ALD material 310 includes two thicknesses (i.e., the first and second thicknesses D3 and D4). However, any number of thicknesses of the ALD material 310 may be formed using the disclosed methods.

CONCLUSION

In some embodiments, the present disclosure includes methods of selectively forming a material. The methods may include forming a blocking material over portions of a substrate, at least one surface of the substrate exposed to the blocking material, forming a first thickness of at least one material by atomic layer deposition on the at least one exposed surface of the substrate and exposing the blocking material to at least one organic material to restore the blocking material.

In additional embodiments, the methods of selectively forming a material may include forming a plurality of recesses in a material overlying a substrate, each of the plurality of recesses exposing a surface of the substrate, forming a blocking material over exposed surfaces of the material, forming a portion of at least one material on the surface of the substrate by atomic layer deposition and exposing the blocking material to an organic material to restore the blocking material.

In yet further embodiments, the methods of selectively forming a material include introducing at least one precursor to a substrate to form a material on at least one surface of the substrate exposed between portions of a blocking material, exposing the substrate to an inert gas to remove the at least one precursor and introducing at least one organic material to form the at least one organic material on at least one of remaining portions of the blocking material and surfaces of a material on the substrate.

Additional embodiments of the present invention include a semiconductor structure that includes a material overlying a silicon substrate and having a plurality of recesses therein, each of the plurality of recesses exposing a surface of the silicon substrate and at least one material comprising a material formed by atomic layer deposition, the at least one material overlying the surface of the silicon substrate and having a thickness of greater than about 25 Å.

While the invention may be susceptible to various modifications and alternative forms in implementation thereof, specific embodiments have been shown by way of example in the drawings and have been described in detail herein. However, it should be understood that the invention is not limited to the particular forms disclosed. Rather, the invention encompasses all modifications, variations and alternatives falling within the scope of the invention as defined by the following appended claims and their legal equivalents.

What is claimed is:

1. A method of selectively forming a material, the method comprising:
   forming a plurality of recesses in a first material overlying a substrate to expose underlying surfaces of the substrate;
   forming a blocking material over exposed surfaces of the first material;
   forming a second material over the exposed surfaces of the substrate by atomic layer deposition without forming the second material over the blockinc material; and
   restoring the blocking material by forming a parylene coating over the blocking material without forming the parylene coating on the second material.

2. The method of claim 1, wherein forming a plurality of recesses in a first material comprises forming a plurality of recesses in a dielectric material.

3. The method of claim 1, wherein forming a second material on the surface of the substrate by atomic layer deposition comprises depositing between about 10 Å and about 25 Å of the second material on the surface of the substrate by atomic layer deposition.

4. The method of claim 1, wherein forming a second material on the surface of the substrate by atomic layer deposition comprises performing between about 60 ALD cycles and about 100 ALD cycles to deposit the second material on the surface of the substrate.

5. The method of claim 1, wherein forming a parylene coating over the blocking material without forming the parylene coating on the second material comprises exposing the blocking material to a parylene in a sublimed or vapor state in a reaction chamber after forming the second material on the surface of the substrate by atomic layer deposition performed in the reaction chamber.

6. The method of claim 1, further comprising forming a third material over the second material on the surface of the substrate by atomic layer deposition, the third material comprising the same material as the second material.

7. The method of claim 6, wherein forming the third material over the second material on the surface of the substrate by atomic layer deposition comprises forming the third material after forming the parylene coating over the blocking material.

8. The method of claim 1, wherein forming a second material over the exposed surfaces of the substrate by atomic layer deposition comprises damaging or degrading the blocking material.

9. The method of claim 1, wherein the first material comprises silicon dioxide.

10. A method of selectively forming a material, the method comprising:
 introducing at least one precursor to a substrate to form a first material on at least one exposed surface of the substrate exposed between portions of a blocking material, the first material comprising a material configured to inhibit formation of a parylene coating thereon;
 exposing the substrate to an inert gas to remove the at least one precursor; and
 forming the parylene coating over remaining portions of the blocking material without forming the parylene coating on the first material.

11. The method of claim 10, wherein the material configured to inhibit formation of the parylene coating thereon comprises a material selected from the group consisting of platinum, gold, silver, nickel, copper, iridium, tungsten, thallium and titanium.

12. The method of claim 10, wherein the blocking material comprises at least one of a photoresist material, polymethylglutarimide (PMGI), polyethylene, polystyrene, polyurethane, poly(methyl methacrylate) (PMMA), phenol formaldehyde, a novolac polycresole, a polyimide, and a fluoro resin.

13. A method of selectively forming a material, the method comprising:
 forming a blocking material over portions of an intermediate material and leaving at least one surface of a substrate exposed, the intermediate material overlying at least a portion of the substrate;
 forming a first thickness of at least one material by atomic layer deposition on the at least one exposed surface of the substrate selective to the blocking material; and
 exposing the blocking material to a parylene in a sublimed or vapor state to form a parylene coating over the blocking material without forming the parylene coating on the at least one material formed by atomic layer deposition.

14. The method of claim 13, wherein forming a blocking material over portions of an intermediate material and leaving at least one surface of a substrate exposed comprises forming a blocking material comprising at least one of a resist material, a polymeric material, an amphiphilic material, a chloroalkyl compound, a chloroalkene, a 1-alkene, and a 1-alkyne over the portions of the intermediate material and leaving at least one surface of the substrate exposed.

15. The method of claim 13, further comprising reactivating the substrate prior to exposing the blocking material to the parylene to form the parylene coating over the blocking material without forming the parylene coating on the at least one material formed by atomic layer deposition.

16. The method of claim 13, wherein forming a first thickness of at least one material by atomic layer deposition on the at least one exposed surface of the substrate selective to the blocking material comprises forming a first thickness of at least one of platinum, gold, silver, nickel, copper, iridium, tungsten, tantalum and titanium by atomic layer deposition on the at least one exposed surface of the substrate selective to the blocking material.

17. The method of claim 13, wherein forming a first thickness of at least one material by atomic layer deposition on the at least one exposed surface of the substrate selective to the blocking material comprises performing between about 60 ALD cycles and about 100 ALD cycles to deposit a thickness of the at least one material on the surface of the substrate by atomic layer deposition.

18. The method of claim 13, further comprising forming a second thickness of the at least one material by atomic layer deposition after forming the parylene coating over the blocking material.

\* \* \* \* \*

UNITED STATES PATENT AND TRADEMARK OFFICE
CERTIFICATE OF CORRECTION

| | | |
|---|---|---|
| PATENT NO. | : 8,945,305 B2 | Page 1 of 1 |
| APPLICATION NO. | : 12/872608 | |
| DATED | : February 3, 2015 | |
| INVENTOR(S) | : Eugene P. Marsh | |

It is certified that error appears in the above-identified patent and that said Letters Patent is hereby corrected as shown below:

In the Claims

In column 14, line 40, in Claim 1, delete "blockinc" and insert -- blocking --, therefor.

Signed and Sealed this
Fifth Day of May, 2015

Michelle K. Lee
*Director of the United States Patent and Trademark Office*